United States Patent
Wake et al.

(10) Patent No.: US 7,652,271 B2
(45) Date of Patent: Jan. 26, 2010

(54) CHARGED-PARTICLE BEAM LITHOGRAPHY WITH GRID MATCHING FOR CORRECTION OF BEAM SHOT POSITION DEVIATION

(75) Inventors: Seiji Wake, Shizuoka (JP); Hitoshi Sunaoshi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 267 days.

(21) Appl. No.: 11/754,598

(22) Filed: May 29, 2007

(65) Prior Publication Data
US 2008/0067441 A1    Mar. 20, 2008

(30) Foreign Application Priority Data
May 30, 2006 (JP) ............................. 2006-149571

(51) Int. Cl.
*H01L 21/027* (2006.01)
*H01J 37/304* (2006.01)
(52) U.S. Cl. ................................. 250/492.22; 250/491.1
(58) Field of Classification Search ............ 250/492.22, 250/491.1
See application file for complete search history.

(56) References Cited

U.S. PATENT DOCUMENTS

| | | | | |
|---|---|---|---|---|
| 7,476,879 B2 * | 1/2009 | Lozes et al. | ............ | 250/492.22 |
| 7,498,591 B2 * | 3/2009 | Lozes et al. | ............ | 250/492.22 |
| 2004/0222386 A1 * | 11/2004 | Schneider et al. | ........ | 250/491.1 |

FOREIGN PATENT DOCUMENTS

JP    2005-32963    2/2005

* cited by examiner

*Primary Examiner*—Jack I Berman
(74) *Attorney, Agent, or Firm*—Oblon, Spivak, McClelland, Maier & Neustadt, L.L.P.

(57) ABSTRACT

A charged-particle beam pattern writing apparatus includes an electric field intensity calculator unit which operates to calculate an electric field intensity of another region different from a specified region of a workpiece due to electrical charge to be electrified by irradiation of a charged particle beam to the specified region, a correction amount calculator unit which calculates based on the electric field intensity a correction amount for correcting an irradiation position upon irradiation of the charged particle beam to the above-noted another region, and a pattern writing unit which irradiates based on the correction amount the charged particle beam to the another region to thereby write or "draw" a pattern therein.

10 Claims, 13 Drawing Sheets

US 7,652,271 B2

CHARGED-PARTICLE BEAM LITHOGRAPHY WITH GRID MATCHING FOR CORRECTION OF BEAM SHOT POSITION DEVIATION

CROSS-REFERENCE TO RELATED APPLICATION

This application claims the benefit of the filing date of Japanese Patent Application No. 2006-149571, filed May 30, 2006, the disclosure of which is incorporated herein by this reference.

FIELD OF THE INVENTION

The present invention relates in general to lithography technologies and, in more particular, to a method and apparatus for writing ultrafine circuit patterns on workpieces by use of a charged particle beam, such as an electron beam.

DESCRIPTION OF RELATED ART

Charged-particle beam lithography that contributes greatly to the advance in miniaturization of semiconductor ULSI devices is a very important process as it has the unique nature of pattern generation unlike other semiconductor manufacturing processes. In recent years, with an increase in integration density of ULSIs, the circuit line width required for semiconductor devices is becoming smaller year by year. To form a desired circuit pattern on these semiconductor devices, a need is felt to use an original or "master" pattern of high precision, also known as a reticle or a photomask. The master pattern is usually fabricated by electron ray (electron beam) pattern writing techniques because of their inherent advantage as to superior image resolution.

See FIG. 13, which shows a typical structure of currently available variable-shaped electron beam (EB) lithographic apparatus. This variable-shaped EB lithography apparatus includes a first aperture plate 410 having a rectangular opening 411 for shaping an incoming electron beam 330, which is emitted from a charged particle source 430. The EB apparatus also includes a second aperture plate 420 having a variable-shaping opening 421 for reshaping the electron beam 330 that passed through the opening 411 into a desired rectangular shape in cross-section. The resultant electron beam that passed through the opening 411 is deflected by a deflector. Then, the beam passes through part of the variable shaping opening 421 to fall onto a workpiece 340, which is mounted on a stage. The stage is driven to move continuously in a specified one direction, e.g., X direction. In brief, a beam component having its rectangular shape capable of penetrating both the opening 411 and the variable shaping opening 421 is irradiated onto the workpiece 340 in its pattern writing area, resulting in pattern drawing therein. The technique that forms any given shape by causing the electron beam to pass through both the opening 411 and the variable shaping opening 421 is called the variable-shaped beam (VSB) system among those skilled in the lithography art.

A problem faced with the prior known approach is as follows. In the process of irradiating the electron beam onto a workpiece such as a mask with a resist film deposited thereon, the workpiece can be electrostatically charged or electrified at a presently pattern-writing position and its nearby positions under the influence of the past irradiated electron beam. Although in traditional variable-shaped EB lithography tools the deviation of a beam irradiation position on the workpiece occurring due to such static electrification phenomena has not specifically been viewed with suspicion, this electrification-caused beam shot position deviation poses serious problems in escalation with the miniaturization of the pattern in feature sizes as stated previously.

One known approach to avoiding the electrification of a workpiece, e.g., wafer, due to the irradiation of an electron beam is disclosed, for example, in JP-A-2005-32963, which employs a technique for forcibly coupling the wafer to ground potential from its conductive layer, such as a chromium (Cr) film underlying a resist film.

It has been stated that advantages of pattern miniaturization do not come without accompanying problems of beam-shot-position deviation or aberration occurrable due to electrostatic charging phenomena.

BRIEF SUMMARY OF THE INVENTION

It is therefore an object of this invention to provide a method and apparatus for correcting deviation of a beam irradiation position otherwise occurring due to electrostatic charging or electrification phenomena.

In accordance with one aspect of this invention, a charged particle beam pattern writing apparatus is provided which includes an electric field intensity calculation unit operative to calculate an electric field intensity of another region different from a specified region of a workpiece due to electrical charge to be electrified by irradiation of a charged particle beam to the specified region, a correction amount calculator unit operative to calculate based on the electric field intensity a correction amount for correcting an irradiation position upon irradiation of the charged particle beam to said another region, and a pattern writing unit operative to irradiate based on the correction amount the charged particle beam to said another region to thereby perform pattern drawing in said another region.

In accordance with another aspect of this invention, a charged particle beam pattern writing apparatus includes an electric field intensity calculator unit operative to virtually divide a pattern writing area of a workpiece subjected to pattern writing using a charged particle beam into a plurality of mesh-shaped cell regions and calculate an electric field intensity of a self cell region due to electrical charge to be electrified due to the charged particle beam being irradiated onto a cell region to be pattern-drawn prior to the self cell region. The apparatus also includes a correction amount calculator unit operative to calculate based on the electric field intensity a correction amount for correcting an irradiation position when irradiating the charged particle beam onto the self cell region to thereby form a correction amount map per cell region. The apparatus further includes a deflection control unit operative to control based on the correction amount map a deflection position of the charged particle beam.

In accordance with still another aspect of the invention, a charged particle beam pattern writing method is provided, which includes the steps of calculating an electric field intensity of another region different from a specified region of a workpiece due to electrical charge to be electrified by irradiation of a charged particle beam onto the specified region of the workpiece, calculating based on the electric field intensity a correction amount for correcting an irradiation position when irradiating the charged particle beam to said another region, and irradiating based on the correction amount the charged particle beam to said another region to thereby perform pattern writing in said another region.

In accordance with a further aspect of the invention, a charged particle beam pattern writing method has the steps of virtually dividing a pattern writing area of a workpiece into a plurality of mesh-like cell regions to calculate an electric field intensity of a self cell region due to electrical charge to be electrified by a charged particle beam being irradiated onto a cell region to be pattern-drawn prior to the self cell region, calculating based on the electric field intensity a correction amount for correcting an irradiation position when irradiating the charged particle beam onto the self cell region, and irradiating based on the correction amount the charged particle beam onto the self cell region to thereby perform pattern writing in the self cell region.

DETAILED DESCRIPTION OF THE INVENTION

In the embodiment as disclosed herein, an explanation below assumes that a charged-particle beam for use therein is an electron beam, although this is not to be construed as limiting the invention. Similar results are obtainable by replacing the electron beam with other similar beams of energy radiation, including but not limited to an ion beam.

Figure 1:
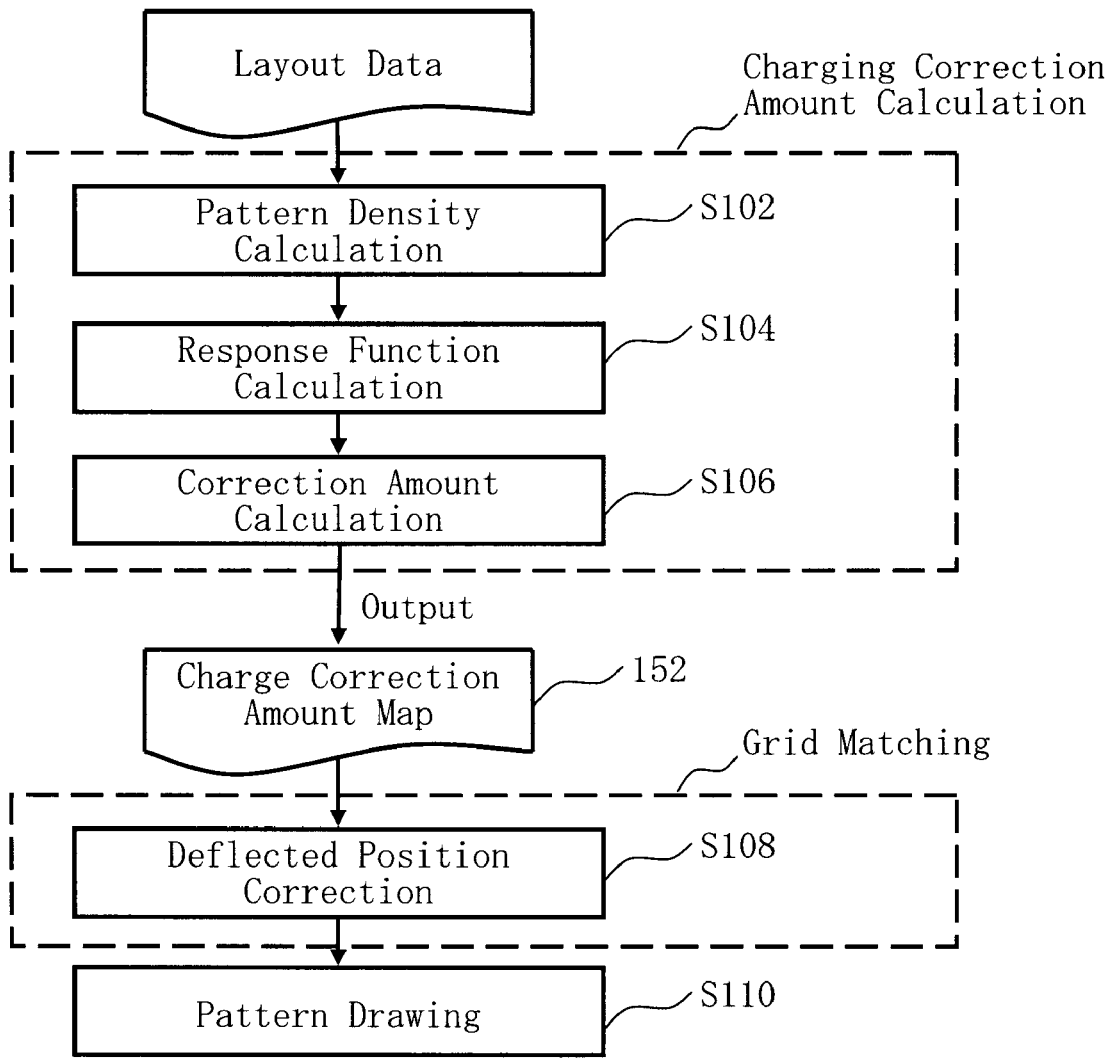
FIG. 1 is a flow diagram showing some major process steps of a pattern writing method embodying this invention.

An electron beam (EB) pattern writing method embodying this invention is shown in FIG. 1 in a flowchart from. As shown in FIG. 1, the EB lithography method includes a sequence of process steps, including a pattern density calculation step S102, a response function calculation step S104, a correction amount calculation step S106, a deflected position correcting step S108, and a pattern writing step S110.

Figure 2:
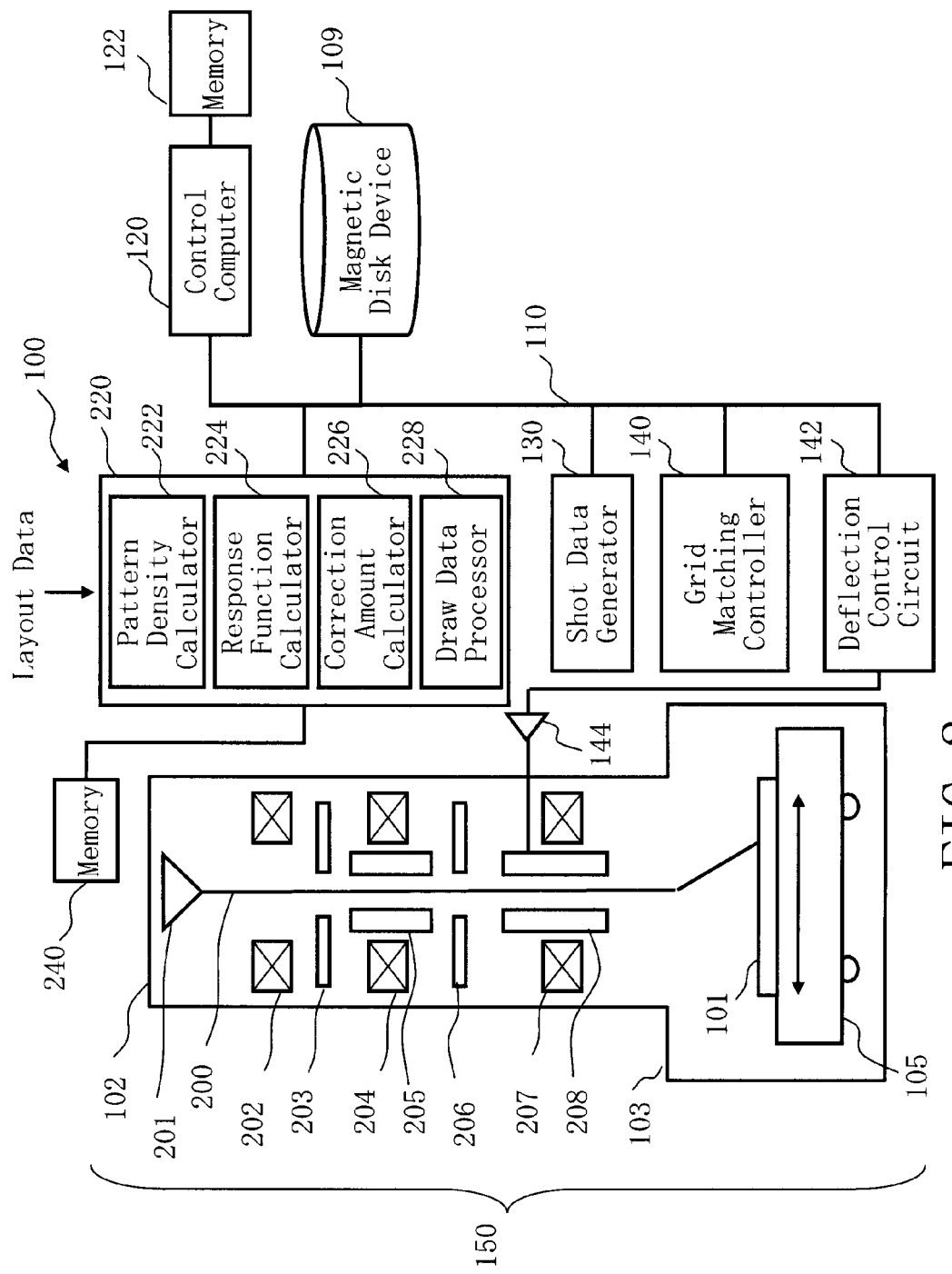
FIG. 2 is a diagram showing an exemplary overall configuration of a pattern writing apparatus also embodying the invention.

One exemplary configuration of an EB lithographic apparatus 100 also embodying the invention is shown in FIG. 2. As shown herein, the EB lithography tool 100 is generally made up of a pattern writing unit 150 and a system control unit operatively associated therewith. The EB tool 100 is one example of the variable-shaped charged-particle beam lithographic apparatus incorporating the principles of the invention. EB tool 100 is for writing a pattern on a workpiece 101. A typical example of the workpiece 101 is a photomask for use in the manufacture of semiconductor devices. The pattern writing unit 150 has a tower-like housing 102, called electron lens barrel, and a pattern writing chamber 103. The electron lens barrel 102 has several components situated therein, including an electron gun assembly 201, illumination lens 202, first aperture 203, projection lens 204, deflector 205, second aperture 206, objective lens 207, and deflector 208. The pattern writing chamber 103 contains therein an X-Y stage 105. A workpiece 105 is mounted on the XY stage 105. The system controller includes a pre-processing computer 220, memory 240, control computer 120, memory 122, magnetic disk device 109, shot data generation unit 130, grid matching control unit 140, deflection control circuit 142 that is one example of deflection control unit, and deflection amplifier 144. The preprocessing computer 220 includes several functional modules, such as a pattern density calculator 222, response function calculator 224, correction amount calculator 226 and pattern draw data processor 228.

The control computer 120, preprocessing computer 220, memory 122, magnetic disk device 109, shot data generator 130, grid matching controller 140 and deflection control circuit 142 are connected via a bus 110. In addition to the above-noted arrangement, the preprocessing computer 220 is connected to the memory 240 via a bus (not shown in the drawing). The control computer 120 is also connected to the memory 122 via a bus (not depicted). The deflection control circuit 142 is connected to the deflection amplifier 144. The deflection amplifier 144 is connected to the deflector 208. The deflector 208 is controlled by the deflection control circuit 142 and is applied a voltage for deflection to a desired position through the deflection amp 144.

Either information to be input to the control computer 120 or each information during and after completion of arithmetic processing is stored in the memory 122 at an appropriate timing on a real-time basis. Similarly, either information being input to the preprocessing computer 220 or each information during and after arithmetic processing is stored in the memory 240 whenever the session gets started.

Shown in FIG. 2 are major components of the EB lithographic tool 100 which relate to the principles of the invention, with other parts known to a skilled person being eliminated herein. Also note that in the preprocessing computer 220 of FIG. 2 which is an example of the computer, this computer is illustratively arranged to execute respective functions of the pattern density calculator 222, response function calculator 224, correction amount calculator 226 and pattern draw data processor 228; however, this is not an exclusively limited one and may be designed by hardware configurations using electrical circuitry. Alternatively, it may be implemented by any possible combination of such hardware using electrical circuits and software programs. Still alternatively, the hardware is employable in combination with firmware.

A charge-particle beam—here, electron beam 20—that is emitted from the electron gun 201 is guided by the illumination lens 202 to illuminate an entirety of the first aperture 203, which has a rectangular hole. Here, the electron beam 200 is shaped to have a rectangular shape in cross-section. Then, the electron beam 200 of first aperture image which passed through the first aperture 203 is projected by the projection lens 204 onto the second aperture 206. The position of first aperture image on the second aperture 206 is deflection-controlled by deflector 205. This permits it to change both in beam shape and in size. Thereafter, the electron beam 200 of second aperture image which passed through the second aperture 206 is focused by the objective lens 207 and then deflected by the deflector 208 under control of the deflection control circuit 142. The deflector 208 may illustratively be a deflector of the electrostatic type. With the operations above, the beam is finally irradiated onto the workpiece 101 that is disposed on the movable XY stage 105 at a desired position thereon.

Figure 3:
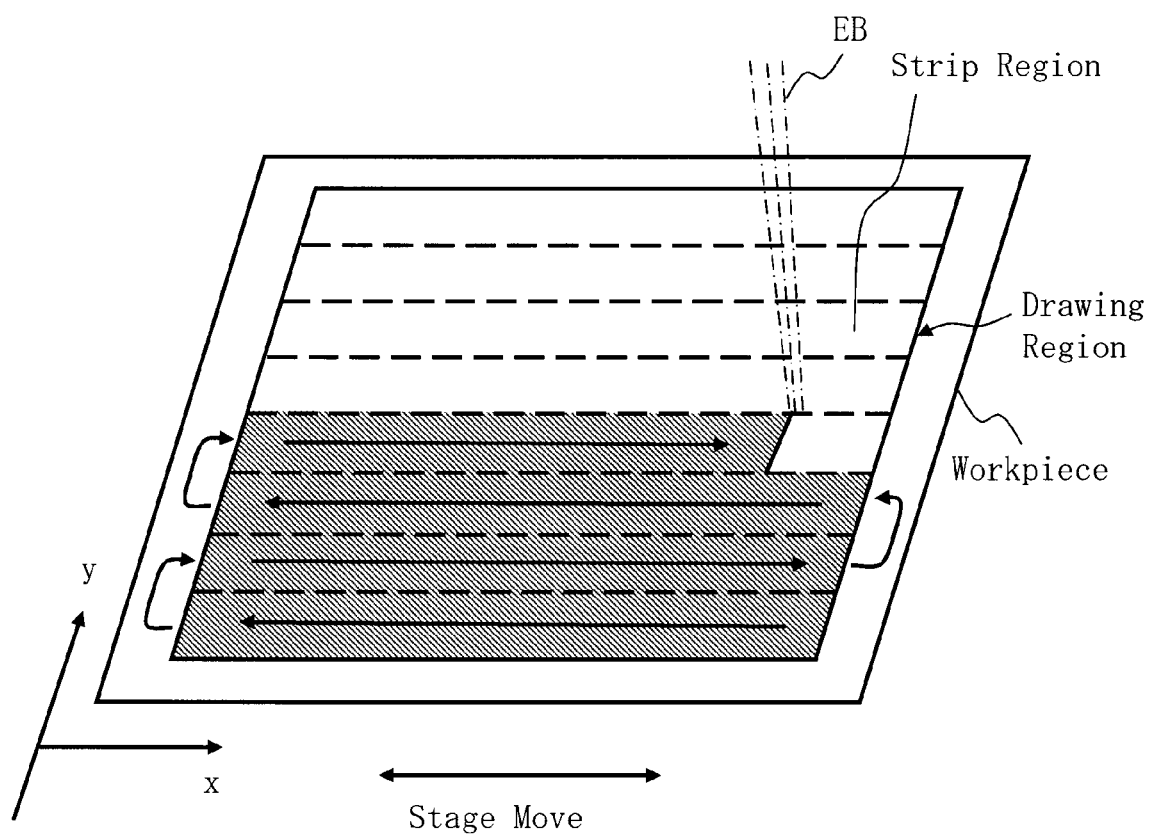
FIG. 3 depicts a perspective view of a workpiece which is mounted on a moving stage structure in the pattern writing apparatus.

A perspective view of the workpiece 101 on the movable XY stage 105 is shown in FIG. 3. When performing the intended pattern writing on the workpiece 101, the electron is beam 200 is irradiated to scan, one at a time, a plurality of virtually divided strip-like surface regions of the workpiece 101 which are virtually divided from the electron beam-deflectable pattern writing (exposure) surface of workpiece 200, while at the same time driving the XY stage 105 to move continuously in X direction, for example. During the continuous movement of the XY stage 105 in X direction, the electron beam 200 is also controlled so that its shot position follows and tracks the stage movement. Moving the stage continuously makes it possible to shorten the length of a time as taken for the pattern writing or "drawing." After having performed pattern writing in one strip region, the XY stage 105 is driven to move in Y direction in a step forwarding action; then, pattern writing is performed for the next strip region in the opposite direction along X direction. By performing pattern drawing operations for respective strip regions in a serpentine manner, the moving time of XY stage 105 is shortened. Additionally in the EB tool 100, upon execution of pattern draw data processing, this data processing is performed while virtually dividing the pattern write area into a plurality of frame regions. In cases where multiple-exposure is not performed, the frame regions usually become the same as the strips. In case the multi-exposure is done, the frames are offset from the strips in a way pursuant to the degree of multiplicity.

Very importantly, the illustrative embodiment is specifically arranged to modelize the deviation of a beam shot position occurring due to electrostatic charging or electrification and then correct this modelized deviation. To this end, an attempt is first made to virtually divide the pattern write area of the workpiece 101 into a matrix or "mesh" of rows and columns of cellular unit regions each having a prespecified grid size. Using these cells, computation is performed to quantitatively determine the amount of electrified charge on a per-cell basis.

Figure 4:
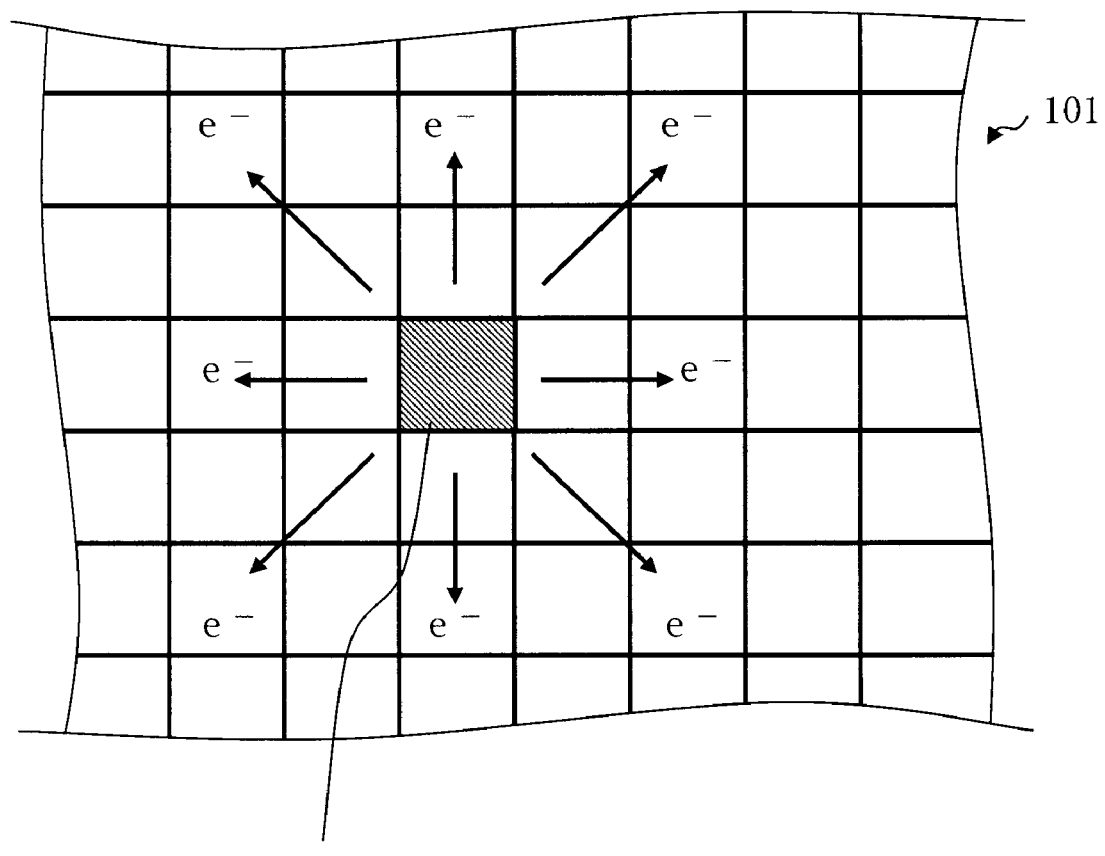
FIG. 4 is a pictorial representation of electrical charging due to the irradiation of an electron beam in the embodiment apparatus.

An exemplary distribution of electrified charge on the workpiece 101 due to the electron beam irradiation in the embodiment is shown in FIG. 4. As shown herein, when guiding the electron beam 200 to irradiate or "shoot" a certain one of the cells, this cell irradiation position can be electrified with electrical charge carriers of the positive polarity, which is opposite to that of electrons. Simultaneously, secondary electrons are emitted from the beam shot position, which behave to spread around this position. This results in that positive charge is electrified at the beam shot position whereas negative charge is electrified at nearby positions therearound.

Figure 5:
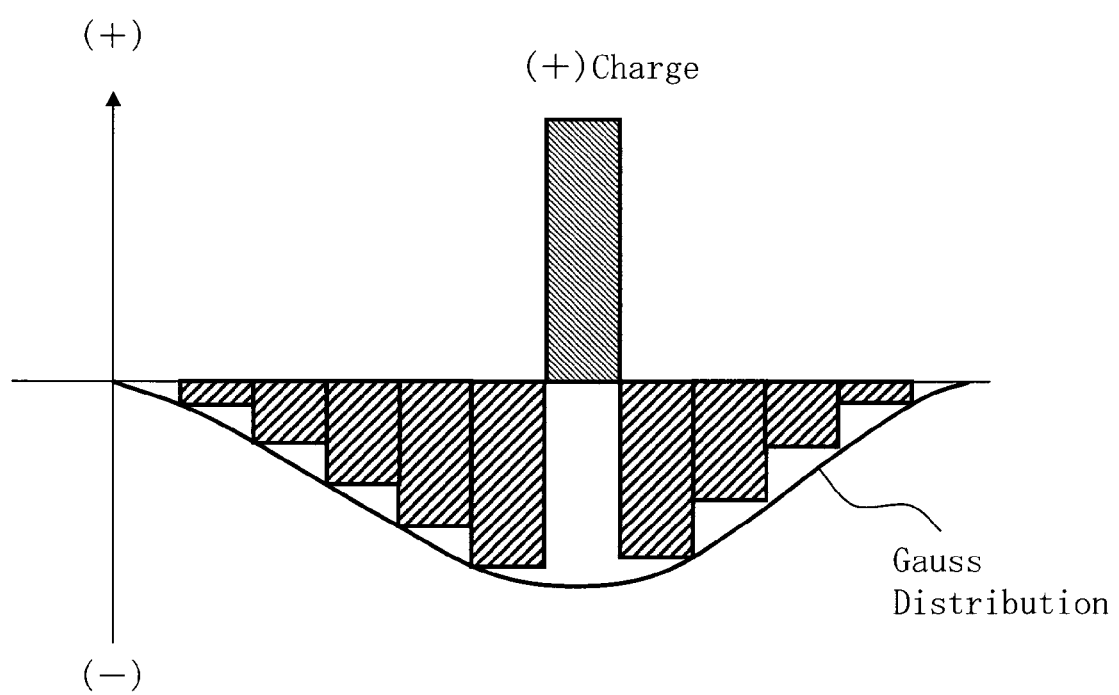
FIG. 5 is a diagram graphically showing a distribution of electrification of electrical charge due to electron beam irradiation in the apparatus.

Turning to FIG. 5, one typical charge distribution is graphically shown. As apparent from this graph, the quantity of secondary electrons that are released around the beam shot position is modelizable to spread in the form of a pattern of Gaussian distribution having a peak corresponding to the amount of electrons being irradiated to the target position.

The discussion herein is under an assumption that the influence of such electrification (the coverage of an extending electrical field) spreads to an extent of about 5 mm in diameter with the beam shot position being as a center thereof. As previously stated, the EB lithographic tool 100 performs data processing for pattern writing in units of virtually divided strip-like frames. Supposing that each frame is 1 mm in width along Y direction for example, irradiation of the electron beam 200 at a certain position would result in the influence of electrification being given to other regions residing in two or three frames. When the individual frame width is further lessened with the growth in pattern miniaturization, the affectable frames are expected to further increase in number.

In view of this, the embodiment is arranged to perform computation on a per-frame basis in a way which follows. In case the n-th frame is subjected to pattern writing, calculation is performed to determine the intensity of an electric field of charge to be received by each cell within those frames of the (n+1)th one and its following ones due to irradiation of the electron beam 200 to a cell which is placed within the n-th frame.

Figure 6:
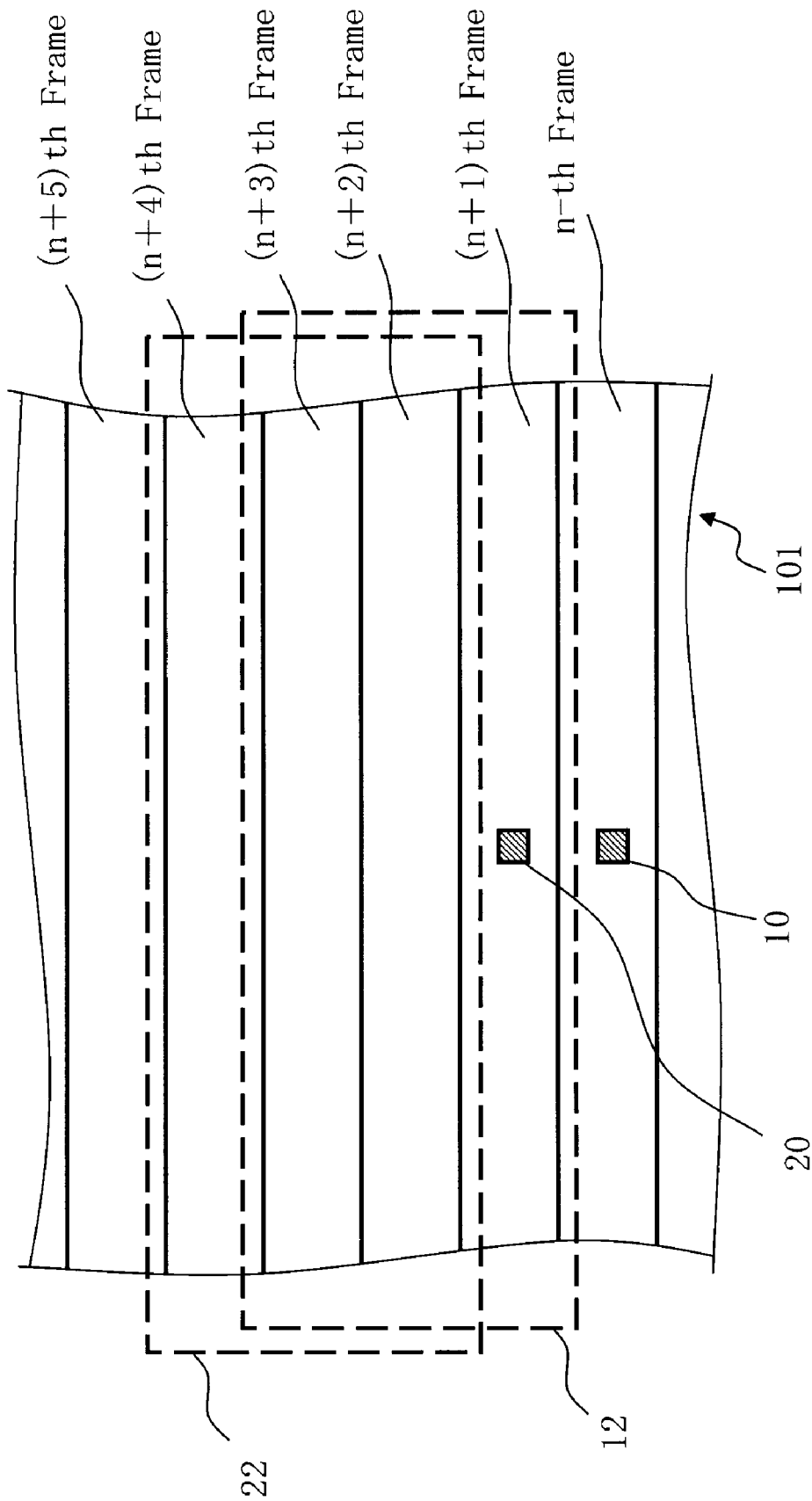
FIG. 6 is a diagram for explanation of an influence range upon irradiation of a beam onto a certain cell region.

See FIG. 6, which is a conceptual diagram for explanation of the range of influence in case of the beam being shot to a certain cell in the embodiment. As shown in FIG. 6, when irradiating the electron beam 200 to a cell 10 which resides within the n-th frame, a region residing in the (n+1)th to (n+3)th frames becomes an influence region 12, as an example. When irradiating the electron beam 200 to a cell 20 within the (n+1)th frame, a region residing in the (n+2)th to (n+4)th frames becomes the influence region 22, by way of example. Accordingly, as the pattern writing progresses, the electrical field intensity is accumulated. Due to the influence of electrical charge being electrified in a cell region that has already been pattern-drawn, a presently irradiated cell region experiences creation of an electric field having its intensity corresponding to that of the accumulated electric field. When shooting the electron beam 200 to such cell region with creation of the electric field of this electric field intensity, electrons are deflected by the influence of such electric field. In view of this, the embodiment is arranged to correct a deviation of the beam shot position by a process having the steps of calculating in advance the electric field intensity to be accumulated in each region and then correcting the beam shot position that is deflected by the deflector 208 from the electric field intensity of the region to be irradiated. This process will be explained below in accordance with respective steps shown in FIG. 1.

Firstly, the preprocessing computer 220 inputs layout data from its associated storage device, such as a magnetic disk device or the like. Based on the layout data, the pattern draw data processor 228 produces pattern draw data. Then, the shot data generator 130 produces shot data based on the draw data.

At the pattern density calculation step S102, the pattern density calculator 222 uses graphics data contained in the input layout data to calculate a pattern density (pattern area density) per cell region (mesh region) with respect to each frame that was virtually mesh-divided to have a prespecified grid size.

Figure 7:
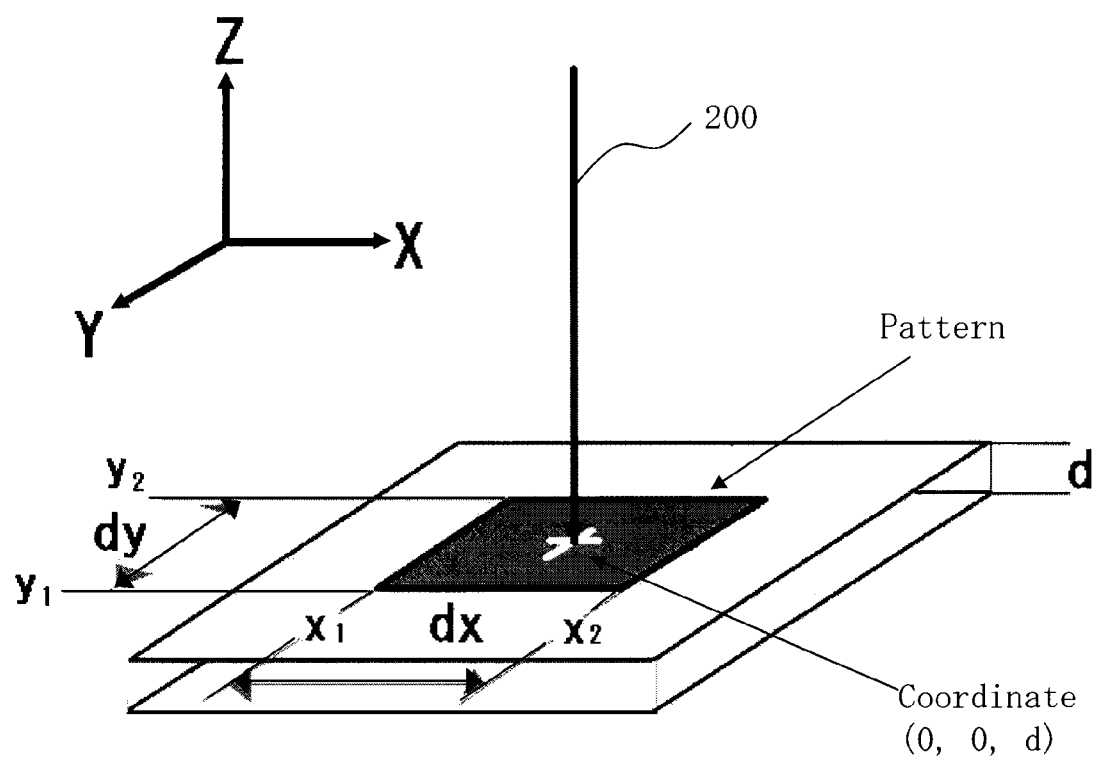
FIG. 7 shows a response function model in a beam irradiation region in the embodiment.

At the response function calculation step S104, the response function calculator 224 that is one example of the electric field intensity calculation unit uses response function to calculate the influence of electrification being presently occurred. A model of the response function in the region being irradiated with the electron beam in the illustrative embodiment is shown in FIG. 7. Additionally, Equation (1) below is a response function formula in this embodiment.

$$Ex(z) = \int_{x_1}^{x_2}\int_{y_1}^{y_2} \frac{\omega}{4\pi\varepsilon_0}\left\{\frac{1}{x^2+y^2+(z+d)^2}\right\} \cdot \frac{x}{\sqrt{x^2+y^2+(z+d)^2}} dxdy - \int_{x_1}^{x_2}\int_{y_1}^{y_2} \frac{\omega}{4\pi\varepsilon_0}\left\{\frac{1}{x^2+y^2+(z-d)^2}\right\} \cdot \frac{x}{\sqrt{x^2+y^2+(z-d)^2}} dxdy$$ (EQU 1)

In this equation, Ex(z) is the electric field intensity (V/m) at a coordinate point (x,y,z), $\varepsilon_0$ is the dielectric constant of a vacuum, d is the distance between accumulated charge and its mirror image charge, and ω is the charge area density (C/m²).

The model shown in FIG. 7 is for obtaining by using a mirror image method the electric field intensity Ex(z) at the height z of a beam-irradiated position with its coordinates (0,0). By solving the above-stated response function formula (1), it is possible to obtain the electric field intensity Ex(z) of the mesh region having its center to which the electron beam 200 is assumed to be irradiated.

Figure 8:
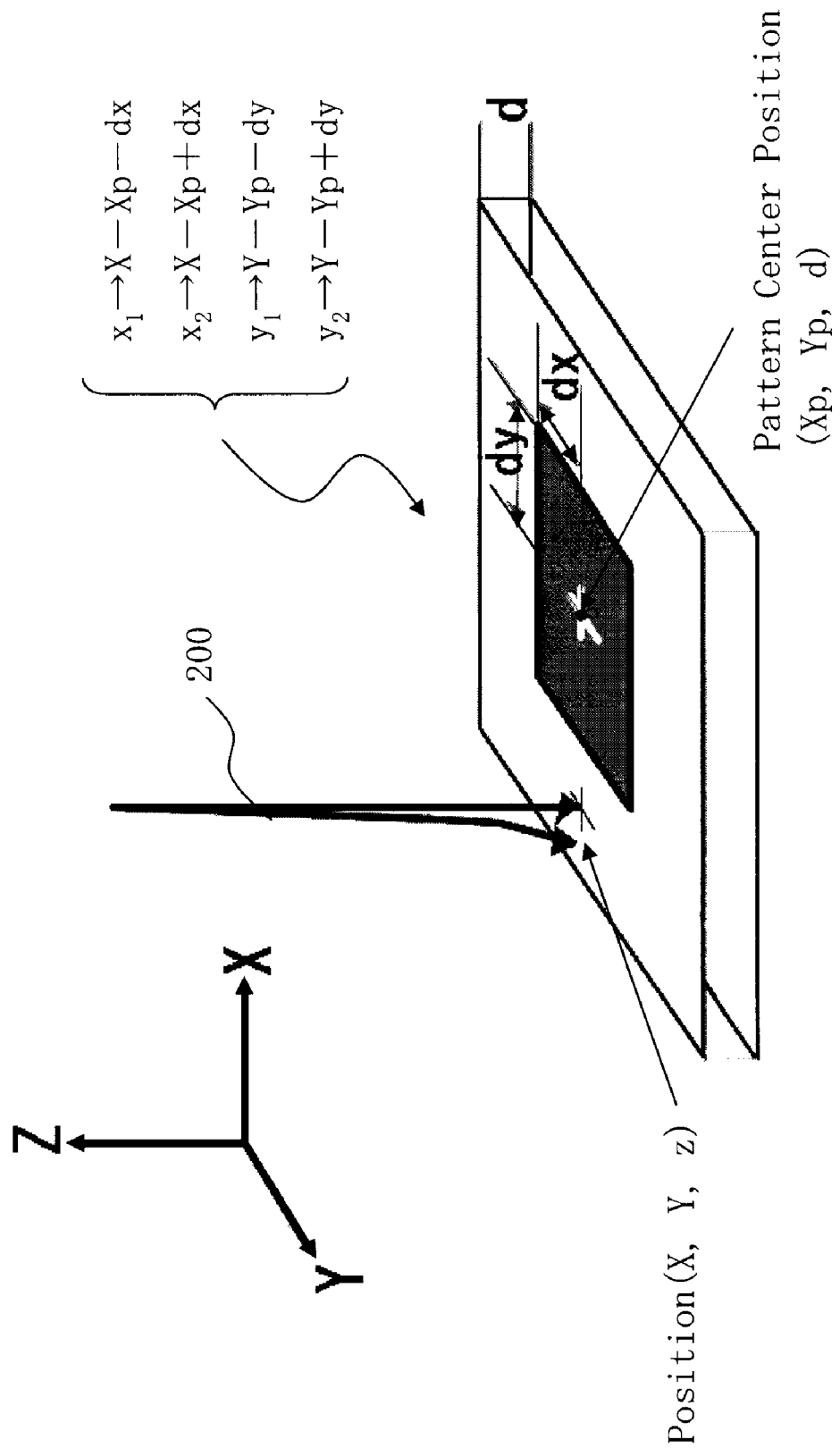
FIG. 8 shows a response function model in another beam irradiation region which is different from that shown in FIG. 7.

A response function model in another region that is different from that shown in FIG. 7 is shown in FIG. 8. When the electron beam 200 is irradiated at a pattern center position (Xp,Yp,d) shown in FIG. 8, an electric field is created at a given coordinate position (X,Y,z). The intensity Ex(z) of this field is obtainable by modifying the integration region of the above-stated response function formula (1) as shown in FIG. 8. More specifically, for integration regions $x_1$ and $x_2$, $x_1$ is changed to X-Xp-dx, and $x_2$ is to X-Xp+dx; for integration regions $y_1$ to $y_2$, $y_1$ is changed to Y-Yp-dy, and $y_2$ is to Y-Yp+dy.

The response function calculator 224 uses such the response function to divide a square area into a matrix of rows and columns of mesh-like cellular regions and then calculates as $(x_{ij},y_{ij})$ the influence (electric field intensity) against the beam shot position at the center of each mesh under an assumption that the electron beam 200 is irradiated only to a centrally located mesh of the square area. Resultant calculation results are stored in the memory 240 in the form of a response function table.

Next, the correction amount calculator 226 calculates a distribution of irradiated charge with respect to each mesh region, from pattern draw sequence information, pattern draw position information and charge distribution data which are involved in the input layout data along with an exposure amount (dose). The amount of positively electrified charge may be determined from the irradiated charge amount to be a positive charge amount which is equivalent to the irradiated charge at the beam shot position. Regarding the amount of negatively electrified secondary electrons that behave to reflect in a radial pattern, this is obtainable in accordance with Gaussian distribution with the irradiated charge being as a maximal value. As for the charge area density ω, the electrified charge is divided by a mesh area.

Then, the correction amount calculator 226 makes reference to the response function table and calculates the intensity of an electrical field that is created at each mesh region of the (n+1)th frame et seq in case the electron beam 200 is irradiated at a given mesh region of the n-th frame by way of example. In other words, calculator 226 calculates the electric field intensity of a "self" mesh region due to charge to be electrified by the electron beam 200 being irradiated to a mesh region to be patter-drawn prior to the self mesh region. In case the electron beam 200 is shot to every mesh region of the n-th frame, the calculator calculates the intensity of an electric field produced in each mesh region of the (n+1)th frame and its following frames. The electric field intensity values thus calculated are accumulated.

After completion of the calculation of the electric field intensity at each mesh region of the (n+1)th frame et seq in the case of the electron beam 200 being irradiated to every mesh region of the n-th frame, an attempt is made to calculate the intensity of an electrical field to be created in each region of the (n+2)th frame and its following ones in case the electron beam 200 is shot to every mesh region of the (n+1)th frame in a similar manner. In this way, the electric field intensity that can affect the next frame et seq is sequentially calculated on a per-frame basis and accumulated. By performing such accumulative addition, it is possible to obtain the electric field intensity at a time Is point that the charged-particle beam is actually irradiated. As a result, it is possible to calculate a more practical correction amount with increased accuracy.

In the way stated above, the electric field intensity of the self mesh region due to electrical charge electrified by the electron beam 200 being irradiated to each mesh region of a frame to be pattern-drawn prior to the self mesh region is subjected to the accumulated addition.

In the correction amount calculation step S106, the correction amount calculator 226 calculate based on the accumulatively added electric field intensity a correction amount for correcting or "amending" the irradiation position in the case of the electron beam 200 being shot to each mesh region. Then, it creates an electrification correction amount map per mesh region. Resultant electrification correction amount map data is stored in the magnetic disk device 109.

At the deflection position correction step S108, the grid matching controller 140 inputs the electrification correction map data from the magnetic disk device 109 and then combines the data with separately prepared optics error correction map data.

Figure 9:
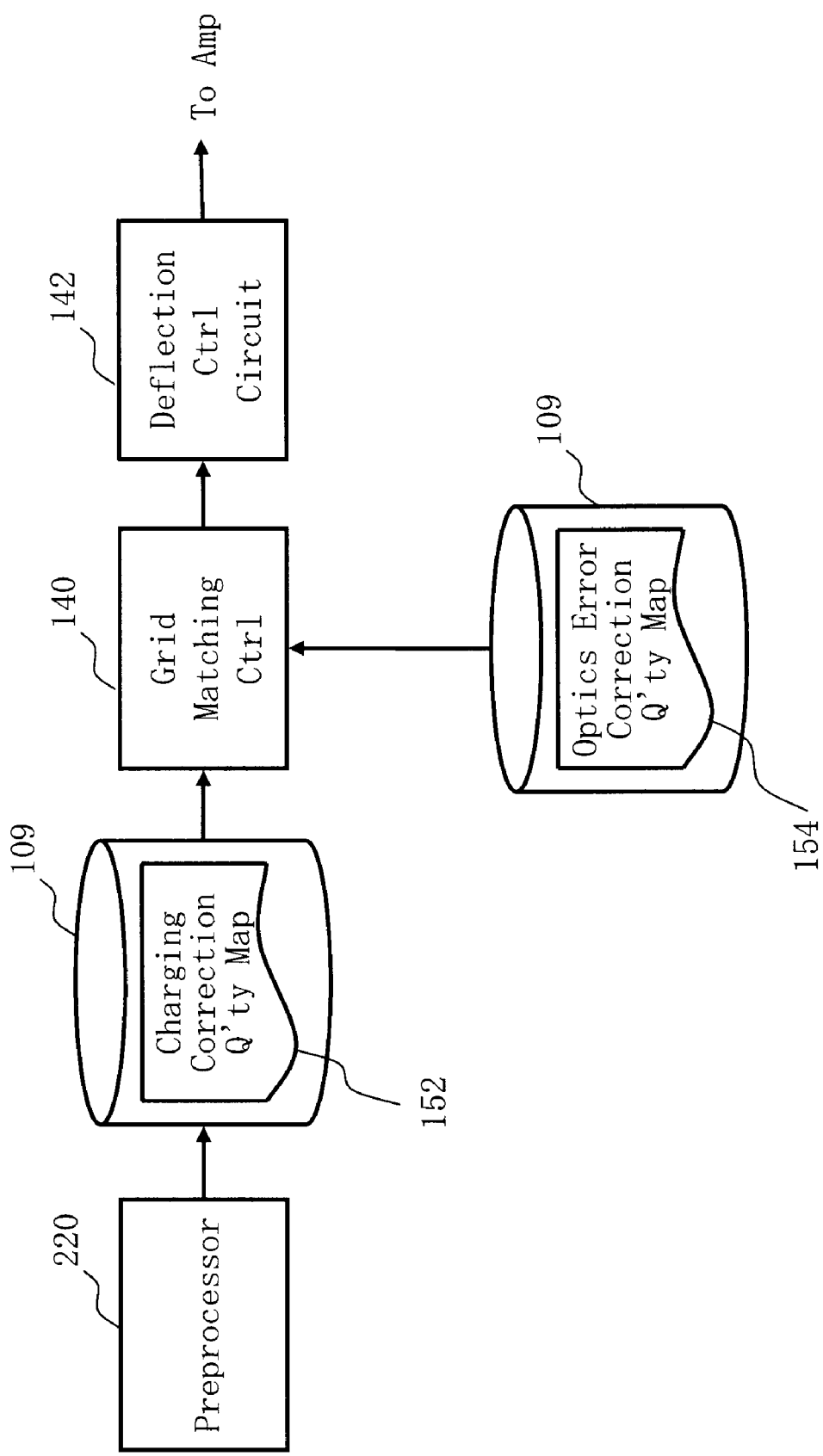
FIG. 9 is a diagram for explanation of a data flow for deflection position correction in the embodiment.

A processor module for executing the deflection position correction in the embodiment is shown in FIG. 9 for explanation of a data flow therein. As shown herein, the electrification correction amount map 152 that was prepared by the preprocessing computer 220 is input via the magnetic disk device 109 to the grid matching controller 140. The separately prepared optics error correction amount map 154 is also input to the grid matching controller 140 via the magnetic disk device 109. Then at the grid matching controller 140, each per-mesh data of the electrification correction amount map 152 and each per-mesh data of optics error correction amount map 154 are combined or "synthesized" together for transmission to the deflection control circuit 142.

In the pattern drawing step S110, the pattern write unit 150 corrects the deflection position that is based on the shot data generated by the shot data generator 130 on the basis of the correction amount that is combined by the grid matching controller 140 and then irradiates the electron beam 200 to each mesh region to thereby write the intended pattern. First, the deflection control circuit 142 controls in the next pattern draw step the deflection position of electron beam 200 to an appropriate shot position that is corrected by use of the electrification correction amount map 152. In other words, the electron beam 200 which passed through the second aperture 206 is deflected to the electrification influence-corrected position, by the deflector 208 to which a voltage applied by the deflection amplifier 144 that is controlled by the deflection control circuit 142.

Figure 10:
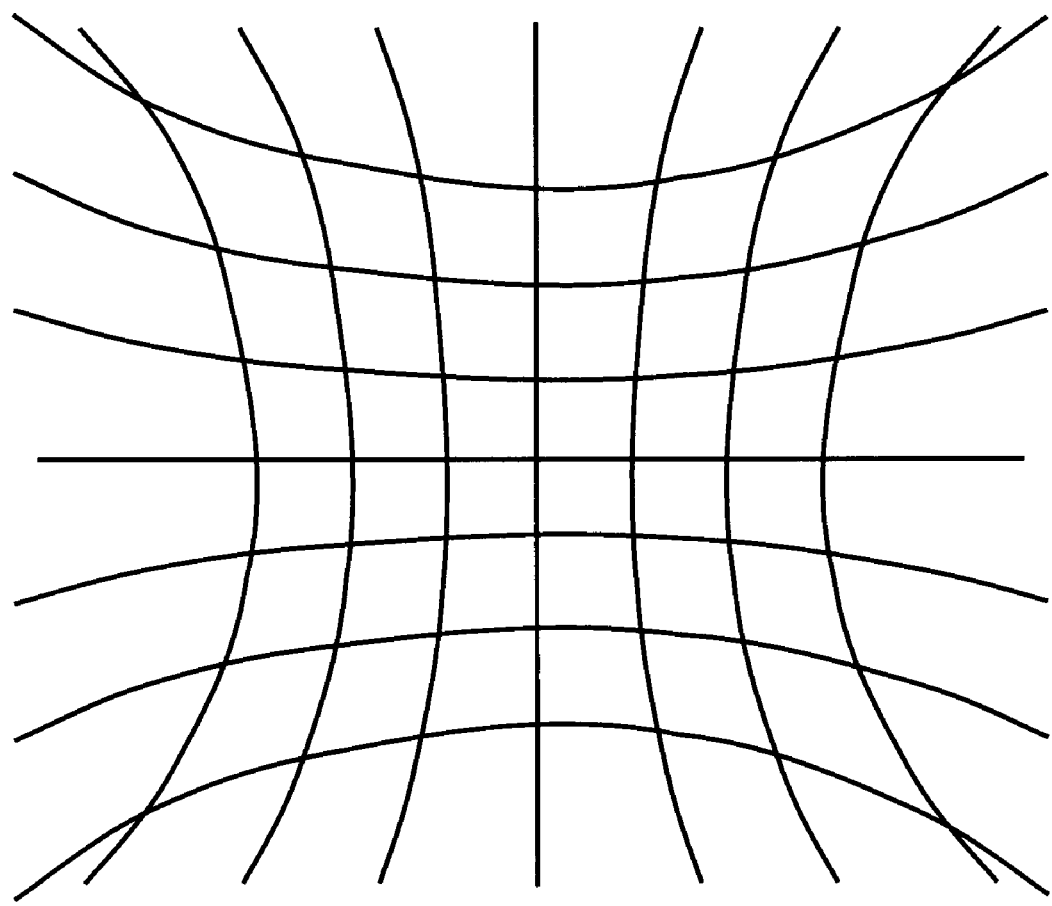
FIG. 10 is a diagram showing an exemplary deviation of irradiation position in the case of no grid matching being performed.

An exemplary electric field intensity distribution of the beam irradiation position and therearound in the absence of the grid matching is shown in FIG. 10. As apparent from this diagram, a globally significant positional deviation is found in the case where the grid matching controller 140 performs none of the electrification and the optics error correction.

Figure 11:
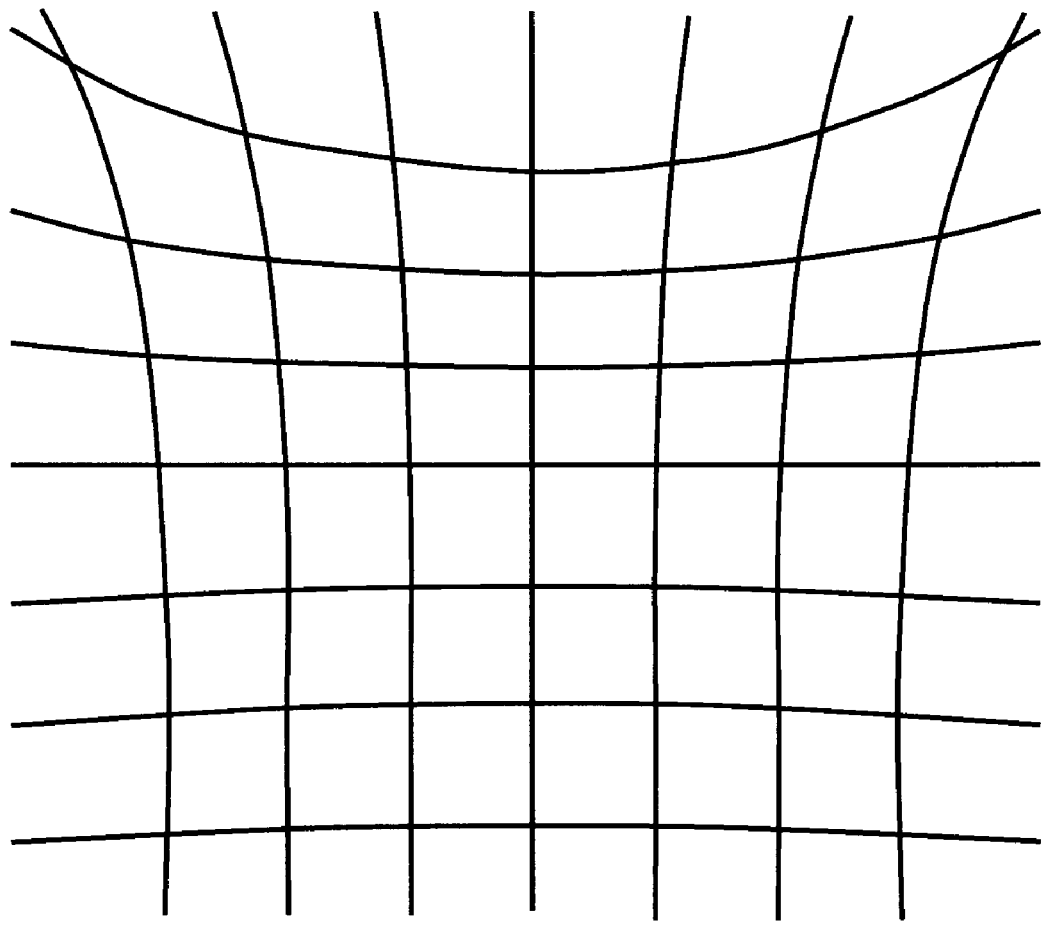
FIG. 11 is a diagram showing an exemplary state of the irradiation position in the case of execution of optical-system error correction only.

Referring next to FIG. 11, there is shown an electric field intensity distribution at and around the beam shot position in the case of only the optics error correction being performed by the grid matching controller 140. In this case, the distribution exhibits a locally occurred distortion as shown herein. In case the frames that are arrayed from the down-to-up direction are sequentially subjected to pattern writing from a down frame, a pattern writing-completed region is electrified with charge as the pattern writing progresses. Due to the influence of this charging, another region—in particular, its upper side region—experiences unwanted deviation or offset of the beam shot position.

Figure 12:
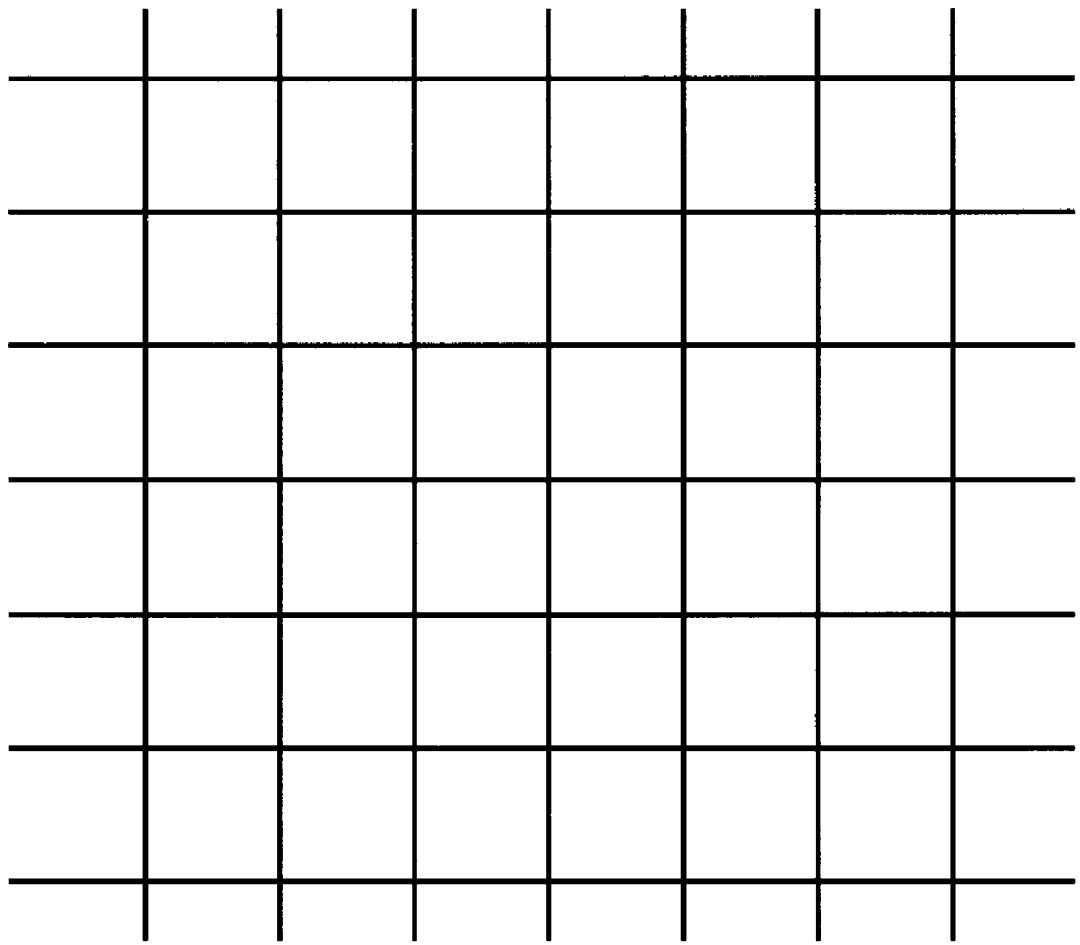
FIG. 12 is a diagram showing an exemplary state of the irradiation position in the case of the grid matching being executed.
Figure 13:
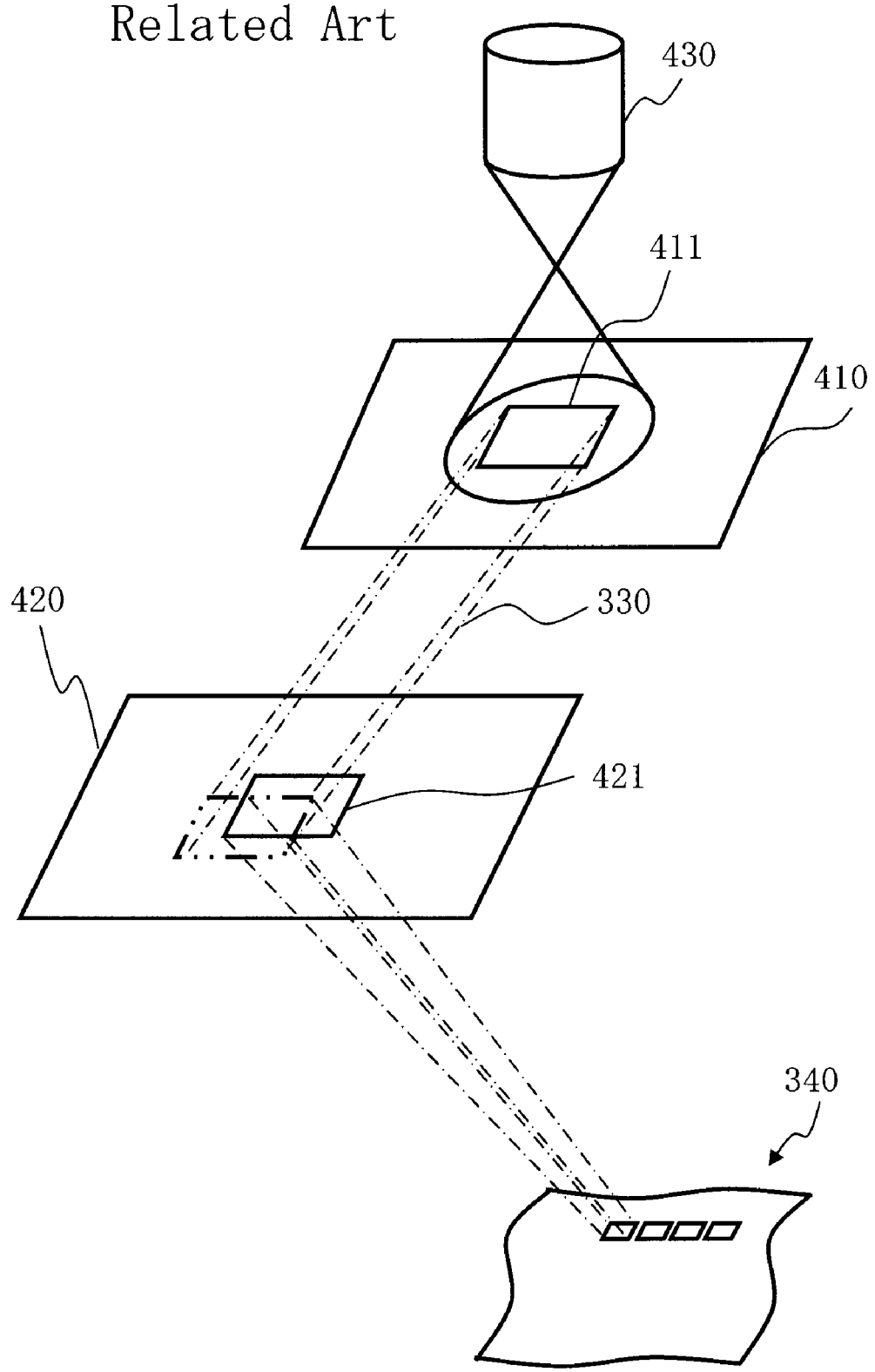
FIG. 13 is a perspective view of an electron beam optics in currently available variable-shaped electron beam lithographic apparatus.

Turning to FIG. 12, an electric field intensity distribution of the beam shot position in the case of the grid matching being performed by the grid matching controller 140 is shown. By further execution of the electrification correction of the embodiment in addition to the optics error correction, it is possible to avoid or at least greatly suppress the above-stated beam shot position deviation as well demonstrated by FIG. 12.

With the arrangement above, it is possible to obtain the correction amount based on the electric field intensity of any desired region to be subject to the pattern writing. Using this correction amount makes it possible to accurately correct the beam shot position upon irradiation of the beam to such desired region. Especially in this embodiment, it is possible to calculate the intended correction amount for correction of irradiation positions in units of mesh-like cell regions. Thus it is possible to achieve the modeling while dividing the pattern write area into cellular or mesh regions. Thus it is possible to correct the beam shot position upon irradiation to any desired cell region. This in turn makes it possible to correct the position deviation of the irradiation position otherwise occurring due to the influence of electrical charge being electrified. This results in the region being accurately pattern-drawn at such corrected position, thereby enabling successful achievement of high-accuracy pattern sizes.

Although in the illustrative embodiment no specific consideration is given to the influence of electrical charge to be electrified to those mesh regions which are subject to pattern writing earlier in the same frame, this is not to be construed as limiting the invention, and the embodiment method and apparatus may alternatively be designed to take account of such influence also.

As apparent from the foregoing, the charged-particle beam pattern writing apparatus embodying the invention is arranged to correct a presently irradiated position by using the electrification correction amount map 152 that is prepared in advance prior to execution of the intended pattern writing to combine this data with the optics error correction amount at the grid matching controller 140. With such the arrangement, it is possible to avoid unwanted interruption or "hang-up" of a pattern writing operation otherwise occurring die to waiting for the completion of calculation of the correction amount of a position that is deflected by electrification effects. In other words, by preparing in advance the electrification correction amount map 152 prior to pattern writing, it becomes possible to prevent or minimize reduction of pattern write throughputs due to the electrification correction amount calculation.

It is noted here that the electrification correction amount map 152 should not necessarily be prepared prior to the pattern writing session and may alternatively be created in a way which follows: calculate the electrification correction amount on a real-time basis as the pattern writing operation progresses, combine it with the optics error correction amount at the grid matching controller 140, and correct the irradiation position.

In the description above, the processing contents or operation contents of those recited in " . . . units" or " . . . steps" are configurable by computer-executable software programs. Alternatively, these are implementable by combinations of software and hardware configurations. Still alternatively, combinations with firmware are also employable. In the case of software programs used, these are stored in storage media, such as a magnetic disk device, magnetic tape device, floppy diskettes (FDs), or read-only memory (ROM). An example is the magnetic disk device 146.

Additionally in the apparatus shown in FIG. 2, the preprocessing computer 220 that becomes the computer and/or the control computer 120 may be modified to be further connected via a bus or buses (not shown) to one or more associative devices including, but not limited to, storage devices, such as a random access memory (RAM), read-only memory (ROM) and hard disk drive (HDD); a data entry device, such as a keyboard with or without a pointing device, called the "mouse"; output means, such as a monitor display, printer, etc.; input/output means, such as an external interface (I/F), floppy diskette drive (FDD), compact disc (CD) device, digital versatile disk (DVD) device, etc.

Although the invention has been described with reference to specific embodiments, the description is illustrative of the invention and is not to be construed as limiting the invention. For instance, while the variable-shaped electron beam lithographic apparatus is used in the illustrative embodiment, the principles of the invention may also be applicable to other types of EB lithography tools. Additionally, the invention does not intend to limit the purpose of usage of the EB lithography apparatus. For example, it may also be applied to the production of optical stepper-use masks or X ray-use masks, except the use purpose of directly forming a resist pattern on masks or wafers.

Also note that while specific descriptions are eliminated of those parts which are not directly necessary for the explanation of this invention, such as apparatus configurations, control schemes and others, it is possible to employ such required apparatus configurations and/or control schemes while selecting appropriate ones from them on a case-by-case basis. For example, regarding the configuration of the controller that controls the EB lithographic tool 100, this was not specifically set forth in the description; however, needless to say, a controller configuration required is used in a situation-sensitive selection manner.

Miscellaneously, all charged-particle beam pattern writing tools and methods which comprise the subject matter of the invention and which are design-modifiable by skilled persons in the art to which the invention pertains should be interpreted to fall within the scope of the invention.

Additional advantages and modification will readily occur to those skilled in the art. Therefore, the invention in its broader aspects is not limited to the specific details and representative embodiments shown and described herein. Various modifications and alternations may be made without departing from the spirit and scope of the general inventive concept as defined by the appended claims and equivalents thereto.

What is claimed is:

1. A lithographic apparatus for writing a pattern using a charged particle beam, said apparatus comprising:
    an electric field intensity calculation unit operative to calculate an electric field intensity of another region different from a specified region of a workpiece due to electrical charge to be electrified by irradiation of a charged particle beam to the specified region;
    a correction amount calculator unit operative to calculate based, on the electric field intensity, a correction amount for correcting an irradiation position upon irradiation of the charged particle beam to said another region; and
    a pattern writing unit operative to irradiate based on the correction amount the charged particle beam to said another region to thereby perform pattern drawing in said another region,
    wherein an electric field intensity $Ex(z)$ at a coordinate point $(x, y, z)$ is calculated by solving the following equation using a dielectric constant of a vacuum $\in_0$, a distance d between accumulated charge by the irradiation and electrical charge of polarity which is opposite to that of the accumulated charge, a charge area density $\omega$, and integration regions $x_1$ to $x_2$ for an x direction, and integration regions $y_1$ to $y_2$ for a y direction, $$Ex(z) = \int_{x_1}^{x_2}\int_{y_1}^{y_2} \frac{\omega}{4\pi\varepsilon_0}\left(\frac{1}{x^2+y^2+(z+d)^2}\right)\cdot\frac{x}{\sqrt{x^2+y^2+(z+d)^2}}dxdy - \int_{x_1}^{x_2}\int_{y_1}^{y_2} \frac{\omega}{4\pi\varepsilon_0}\left\{\frac{1}{x^2+y^2+(z-d)^2}\right\}\cdot\frac{x}{\sqrt{x^2+y^2+(z-d)^2}}dxdy.$$

2. The apparatus according to claim 1, wherein said electric field intensity is calculated by use of a Gaussian distribution.

3. The apparatus according to claim 2, wherein said electric field intensity is calculated in accordance with the Gaussian distribution with an amount of electrical charge to be irradiated to said specified region being as a maximal value.

4. A charged particle beam pattern writing apparatus comprising:
    an electric field intensity calculator unit operative to virtually divide a pattern writing area of a workpiece subjected to pattern writing using a charged particle beam into a plurality of mesh-shaped cell regions and calculate an electric field intensity of a self cell region due to electrical charge to be electrified due to the charged particle beam being irradiated onto a cell region to be pattern-drawn prior to the self cell region;
    a correction amount calculator unit operative to calculate, based on the electric field intensity, a correction amount for correcting an irradiation position when irradiating the charged particle beam onto said self cell region to thereby form a correction amount map per cell region; and
    a deflection control unit operative to control, based on the correction amount map, a deflection position of the charged particle beam,
    wherein an electric field intensity $Ex(z)$ at a coordinate point $(x, y, z)$ is calculated by solving the following equation using a dielectric constant of a vacuum $\in_0$, a distance d between accumulated charge by the irradiation and electrical charge of polarity which is opposite to that of the accumulated charge, a charge area density $\omega$, and integration regions $x_1$ to $x_2$ for an x direction, and integration regions $y_1$ to $y_2$ for a y direction, $$Ex(z) = \int_{x_1}^{x_2}\int_{y_1}^{y_2} \frac{\omega}{4\pi\varepsilon_0}\left(\frac{1}{x^2+y^2+(z+d)^2}\right)\cdot\frac{x}{\sqrt{x^2+y^2+(z+d)^2}}dxdy - \int_{x_1}^{x_2}\int_{y_1}^{y_2} \frac{\omega}{4\pi\varepsilon_0}\left\{\frac{1}{x^2+y^2+(z-d)^2}\right\}\cdot\frac{x}{\sqrt{x^2+y^2+(z-d)^2}}dxdy.$$

5. The apparatus according to claim 4, wherein in a case where the plurality of cell regions are sequentially irradiated, the electric field intensity of the self cell region by means of electrical charge being electrified due to the charged particle beam being irradiated onto each cell is cumulatively added.

6. The apparatus according to claim 5, wherein the electric field intensity is calculated by using a Gaussian distribution.

7. The apparatus according to claim 6, wherein said electric field intensity is calculated in accordance with the Gaussian distribution with an amount of charge to be irradiated to said specified region being as a maximum value thereof.

8. A charged particle beam pattern writing method comprising:
    calculating an electric field intensity of another region different from a specified region of a workpiece due to electrical charge to be electrified by irradiation of a charged particle beam onto the specified region of the workpiece;
    calculating, based on the electric field intensity, a correction amount for correcting an irradiation position when irradiating the charged particle beam to said another region; and
    irradiating based on the correction amount the charged particle beam to said another region to thereby perform pattern writing in said another region,
    wherein an electric field intensity $Ex(z)$ at a coordinate point $(x, y, z)$ is calculated by solving the following equation using a dielectric constant of a vacuum $\in_0$, a distance d between accumulated charge by the irradiation and electrical charge of polarity which is opposite to that of the accumulated charge, a charge area density $\omega$, and integration regions $x_1$ to $x_2$ for an x direction, and integration regions $y_1$ to $y_2$ for a y direction, $$Ex(z) = \int_{x_1}^{x_2}\int_{y_1}^{y_2} \frac{\omega}{4\pi\varepsilon_0}\left(\frac{1}{x^2+y^2+(z+d)^2}\right)\cdot\frac{x}{\sqrt{x^2+y^2+(z+d)^2}}dxdy - \int_{x_1}^{x_2}\int_{y_1}^{y_2} \frac{\omega}{4\pi\varepsilon_0}\left\{\frac{1}{x^2+y^2+(z-d)^2}\right\}\cdot\frac{x}{\sqrt{x^2+y^2+(z-d)^2}}dxdy.$$

9. A charged particle beam pattern writing method comprising:
    virtually dividing a pattern writing area of a workpiece into a plurality of mesh-like cell regions to calculate an electric field intensity of a self cell region due to electrical charge to be electrified by a charged particle beam being irradiated onto a cell region to be pattern-drawn prior to the self cell region;

calculating, based on the electric field intensity, a correction amount for correcting an irradiation position when irradiating the charged particle beam onto said self cell region; and irradiating based on the correction amount the charged particle beam onto said self cell region to thereby perform pattern writing in said self cell region, wherein an electric field intensity $Ex(z)$ at a coordinate point $(x, y, z)$ is calculated by solving the following equation using a dielectric constant of a vacuum $\epsilon_0$, a distance d between accumulated charge by the irradiation and electrical charge of polarity which is opposite to that of the accumulated charge, a charge area density $\omega$, and integration regions $x_1$ to $x_2$ for an x direction, and integration regions $y_1$ to $y_2$ for a y direction, $$Ex(z) = \int_{x_1}^{x_2}\int_{y_1}^{y_2} \frac{\omega}{4\pi\epsilon_0}\left(\frac{1}{x^2+y^2+(z+d)^2}\right)\cdot\frac{x}{\sqrt{x^2+y^2+(z+d)^2}}dxdy - \int_{x_1}^{x_2}\int_{y_1}^{y_2} \frac{\omega}{4\pi\epsilon_0}\left\{\frac{1}{x^2+y^2+(z-d)^2}\right\}\cdot\frac{x}{\sqrt{x^2+y^2+(z-d)^2}}dxdy.$$

10. The method according to claim 9, wherein during calculation of the electric field intensity, when sequentially irradiating a plurality of cell regions, an electric field intensity due to electrical charge to be electrified by the charged particle beam being irradiated to each cell is added cumulatively.

* * * * *